(12) United States Patent
Masui et al.

(10) Patent No.: US 7,781,796 B2
(45) Date of Patent: Aug. 24, 2010

(54) NITRIDE SEMICONDUCTOR LASER ELEMENT

(75) Inventors: Shingo Masui, Anan (JP); Kazutaka Tsukayama, Tokushima (JP)

(73) Assignee: Nichia Corporation, Anan-shi (JP)

( * ) Notice: Subject to any disclaimer, the term of this patent is extended or adjusted under 35 U.S.C. 154(b) by 469 days.

(21) Appl. No.: 11/812,006

(22) Filed: Jun. 14, 2007

(65) Prior Publication Data

US 2008/0002748 A1 Jan. 3, 2008

(30) Foreign Application Priority Data

Jun. 19, 2006 (JP) ............................. 2006-169221
Jun. 8, 2007 (JP) ............................. 2007-152772

(51) Int. Cl.
*H01L 33/00* (2010.01)

(52) U.S. Cl. ............... 257/103; 257/93; 257/E33.005; 257/E33.006; 257/E33.007; 257/E33.016; 257/E33.023; 257/E33.025; 257/E33.028; 257/E33.03; 257/E33.033; 257/E33.034; 257/E33.049; 257/E33.054; 438/31; 438/32; 438/39; 438/44; 438/46; 438/47; 438/77; 438/40; 438/41; 438/42; 372/96

(58) Field of Classification Search .................. 257/94, 257/103, E33.005–E33.007, E33.016, E33.023, 257/E33.025, E33.028, E33.03, E33.033, 257/E33.034, E33.049, E33.054; 438/31, 438/32, 39–44, 46, 47, 77; 372/45, 46, 50, 372/96

See application file for complete search history.

(56) References Cited

U.S. PATENT DOCUMENTS

| | | | | |
|---|---|---|---|---|
| 4,799,229 A | * | 1/1989 | Miyazawa et al. | 372/50.12 |
| 4,941,146 A | * | 7/1990 | Kobayashi | 372/45.01 |
| 5,093,835 A | * | 3/1992 | Takemoto et al. | 372/45.01 |
| 6,574,256 B1 | | 6/2003 | Hofstetter et al. | |
| 2001/0004488 A1 | * | 6/2001 | Morita | 428/209 |
| 2001/0032976 A1 | * | 10/2001 | Ishikawa et al. | 257/14 |
| 2002/0046693 A1 | * | 4/2002 | Kiyoku et al. | 117/8 |
| 2003/0037722 A1 | * | 2/2003 | Kiyoku et al. | 117/84 |
| 2003/0162340 A1 | * | 8/2003 | Tezen | 438/184 |
| 2004/0094773 A1 | * | 5/2004 | Kiyoku et al. | 257/103 |
| 2005/0056850 A1 | * | 3/2005 | Taki | 257/79 |
| 2005/0202682 A1 | * | 9/2005 | Kiyoku et al. | 438/762 |

FOREIGN PATENT DOCUMENTS

| | | |
|---|---|---|
| JP | H8-195530 A | 7/1996 |
| JP | H9-191153 A | 7/1997 |
| JP | 2000-223784 A | 8/2000 |
| JP | 2001-203422 A | 7/2001 |
| JP | 2002-131567 A | 5/2002 |

* cited by examiner

*Primary Examiner*—Lynne A Gurley
*Assistant Examiner*—Meiya Li
(74) *Attorney, Agent, or Firm*—Global IP Counselors, LLP

(57) ABSTRACT

A nitride semiconductor laser element includes a substrate and a nitride semiconductor layer in which a first semiconductor layer, an active layer, and a second semiconductor layer are laminated in this order on the substrate. At least one of the first semiconductor layer and the second semiconductor layer includes a first section forming recessed and raised portions and a second section embedding the recessed and raised portions of the first section. A region with a higher aluminum mixed crystal ratio than the second section that embeds the recessed and raised portions is disposed on top faces of the raised portions. The nitride semiconductor layer defines resonant planes, and the recessed and raised portions are formed in a shape of stripes that extend substantially parallel to the resonant planes.

28 Claims, 7 Drawing Sheets

Wavelength (nm)

Wavelength (nm)

NITRIDE SEMICONDUCTOR LASER ELEMENT

CROSS-REFERENCE TO RELATED APPLICATIONS

This application claims priority to Japanese Patent Application Nos. 2006-169221 and 2007-152772. The entire disclosure of Japanese Patent Application Nos. 2006-169221 and 2007-152772 are hereby incorporated herein by reference.

BACKGROUND OF THE INVENTION

1. Field of the Invention

The present invention relates to a nitride semiconductor laser element, and more particularly relates to a nitride semiconductor laser element utilized a diffraction grating layer.

2. Background Information

Today it is considered possible to oscillate a semiconductor laser made from a nitride semiconductor over a wide range of wavelength bands, from the ultraviolet band to red, and such lasers can not only be used in DVDs and other such optical disk systems that allow information to be recorded and reproduced in large capacity and high density, but also hold promise as a light source or the like for laser printers, optical networks, and so on.

A semiconductor laser element generally has a certain energy gap width centered on an energy gap which is determined by the active layer, so the emission wavelength depends on it, and the gain of the light amplification increases. Thus, there are a number of longitudinal modes with a mode interval depending on the cavity length. In addition to this broad mode distribution, this distribution tends to shift toward the longer wavelength side while it significantly varies according to the output or the drive temperature of the laser element, so when optical communication is performed over a long distance, for example, the transmission rate is different for each mode, and there is scattering.

Because of this or the like, particularly in optical communications and other such applications, a vertical single-mode, single-frequency laser is required, and a DFB (distributed feedback) laser diode has been proposed to obtain a distinct single longitudinal mode emission (see, for example, Japanese Laid-Open Patent Application H8-195530, H9-191153, 2000-223784, 2001-203422 and 2002-131567).

With this DFB laser diode, a diffraction grating layer that reflects light periodically is provided parallel to the active layer in a double hetero structure, and it is believed that light generated in the active layer is periodically reflected by the period of this diffraction grating, and the peaks and valleys of the original light and the reflected light match up and reinforce each other, allowing a laser beam output with a single frequency to be obtained.

With DFB laser diodes proposed in the past, however, the effect of the diffraction grating was still not satisfactory.

For instance, to obtain a satisfactory diffraction grating effect with a DFB laser diode based on gallium nitride, recessed and raised portions have to be precisely formed on the nitride semiconductor laser in order to form the diffraction grating. Also, the refractive index differential needs to be provided more efficiently in this diffraction grating. To this end, it is possible to obtain a refractive index differential by increasing the depth of the recessed and raised portions of the diffraction grating, but this poses problems in terms of mass production and reproducibility.

Also, even if these recessed and raised portions can be formed, when a semiconductor is regrown over this diffraction grating, there is a problem in that recessed and raised portions are produced on the growth surface, and it is difficult to ensure good performance of the laser element itself.

SUMMARY OF THE INVENTION

The present invention was conceived in light of the above problems, and it is an object thereof to provide a nitride semiconductor laser element that has a simple constitution and does not entail any complication processing or the like, so that the refractive index differential can be effectively increased in the diffraction grating, and the threshold current can be lowered.

The present invention provides a nitride semiconductor laser element, comprising a substrate and a nitride semiconductor layer in which a first semiconductor layer, an active layer, and a second semiconductor layer are laminated in this order on the substrate, wherein recessed and raised portions are formed in the first semiconductor layer and/or the second semiconductor layer, a semiconductor layer that embeds the recessed and raised portions are formed on the semiconductor layer in which said recessed and raised portions are formed, and a region with a higher aluminum mixed crystal ratio than the semiconductor layer that embeds the recessed and raised portions is disposed on the top faces of the raised portions.

Further, the present invention provides a nitride semiconductor laser element, comprising a substrate and a nitride semiconductor layer in which a first semiconductor layer, an active layer, and a second semiconductor layer are laminated in this order on the substrate, wherein recessed and raised portions are formed in the first semiconductor layer and/or the second semiconductor layer, a semiconductor layer that embeds the recessed and raised portions are formed on the semiconductor layer in which said recessed and raised portions are formed, and a region with a higher aluminum mixed crystal ratio than the semiconductor layer in which the recessed and raised portions are formed and/or the semiconductor layer that embeds the recessed and raised portions is disposed between the raised portions and the semiconductor layer that embeds the recessed and raised portions.

According to the nitride semiconductor laser element of the present invention, it is possible to increase the refractive index differential in the diffraction grating, and to lower the threshold current.

DETAILED DESCRIPTION OF THE PREFERRED EMBODIMENTS

Figure 1A:
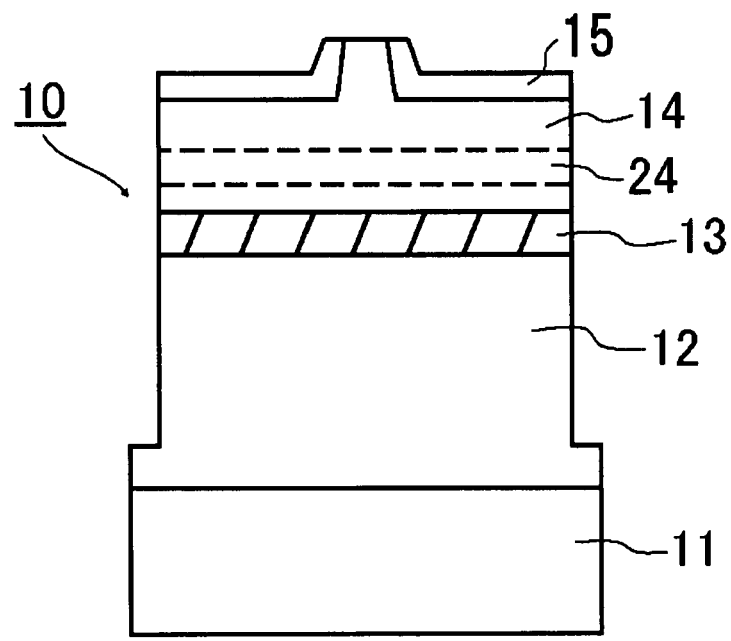
FIG. 1a is a vertical cross section to the ridge stripe and FIG. 1b is a parallel cross section to the ridge stripe, illustrating the structure of the laser element of the present invention, respectively.

The nitride semiconductor laser element of the present invention primarily comprises a substrate and a nitride semiconductor layer in which a first semiconductor layer, an active layer, and a second semiconductor layer are laminated in that order over the substrate. A typical example is the laser element shown in FIG. 1. Furthermore, the first semiconductor layer and the second semiconductor layer are respectively equipped with a first electrode and a second electrode that are electrically connected. Here, the first semiconductor layer includes at least one layer containing an n-type or p-type impurity. The second semiconductor layer includes at least one layer containing an n-type or p-type impurity that is of the opposite conductivity type from that of the first semiconductor layer. The first and second semiconductor layers both may have either a single-layer or multilayer structure, and in the case of a multilayer structure, not all of the layers that make up the structure need to exhibit n-type or p-type conductivity. Furthermore, in the following description a layer disposed on the n-type layer side from the active layer may be referred to as an n-type layer or n-side layer, and a layer disposed on the p-type layer side from the active layer as a p-type layer or p-side layer.

Substrate

The substrate used for the nitride semiconductor laser of the present invention may be different type from nitride semiconductor substrates or nitride semiconductor substrates. The different type of substrates include insulating substrates, such as sapphire, spinel ($MgAl_2O_4$) having a main face of C plane, A plane or R plane; SiC (6H, 4H, 3C), ZnS, ZnO, GaAs, Si; oxide substrates which are lattice-matched to a nitride semiconductor; and substrates which are well known and be able to grow a nitride semiconductor layer thereon, among these sapphire and spinel are preferred. The surface of the substrate may have an off angle of about 0.01 to 0.3°, and may further have a stepped off angle. This prevents fine cracks from forming in the interior of the active layer and the nitride semiconductor layers that make up the element.

When a different type of substrate is used, an under layer (including a protective layer for performing lateral growth), a contact layer, or the like may be formed, but when a nitride semiconductor substrate (such as a GaN substrate) is used, these other layers do not necessarily have to be formed, and may be omitted.

When the different type of substrate is used, an element structure may be formed with a single substrate of a nitride semiconductor by growing the under layer or the like composed of a nitride semiconductor layer as the lower layer of the element structure on the different type of substrate, and then removing the different type of substrate by polishing or another such method. Also, the different type of substrate may be removed during or after the formation of the element structure.

Under Layer

An under layer composed of a nitride semiconductor and including a buffer layer or the like (not shown) may be formed on the substrate.

A buffer layer including a layer which is composed of, for example, $In_\alpha Al_\beta Ga_{1-\alpha-\beta}N$ ($0\leq\alpha$, $0\leq\beta$, $\alpha+\beta\leq1$), or other layer (e.g., AlN, GaN, AlGaN, InGaN etc., preferably GaN) may be formed in the thickness of several ten angstroms to several hundred angstroms at a temperature from 300° C. to 900° C. A buffer layer is preferable for preventing dislocation by reducing lattice constant mismatching between a different type of substrate and a nitride semiconductor layer grown at high temperature.

The under layer with reduced dislocations and produced by lateral growth can be formed by partially growing a first nitride semiconductor layer on the buffer layer, and then growing a second nitride semiconductor layer using this first nitride semiconductor layer as a growth nucleus. The under layer is preferably a nitride semiconductor expressed by $Al_xGa_{1-x}N$ ($0\leq x\leq1$), and the thickness of the layer is preferably about 2 to about 30 μm. It is good for the region produced by lateral growth either to have no more than about $1\times10^7$ dislocations per square centimeter, and preferably no more than about $1\times10^6/cm^2$, or to have local areas with few dislocations. Furthermore, this under layer may contain an n-type impurity, such as Si, Sn, Ge, Se, C, Ti, O, etc., in an amount of about $1\times10^{16}$ to $5\times10^{21}$ cm$^{-3}$, for example.

Semiconductor Layer

For the nitride semiconductor laser element, a first and a second semiconductor layer may include the III-V nitride semiconductor layer having a general formula of $In_xAl_yGa_{1-x-y}N$ ($0\leq x$, $0\leq y$, $x+y\leq1$). In addition to this, it may be used the semiconductor layer which is partly substituted with B as a group III element, or is substituted a part of N as a group V element with P or As. The semiconductor layer can be formed by any conventional method, such as a vapor phase growth method such as MOVPE (Metal-Organic Vapor Phase Epitaxy), HVPE (Hydride Vapor Phase Epitaxy), MBE (Molecular Beam Epitaxy), or the like.

The n-type semiconductor layer may doped with at least one n-type impurity of IV or VI group elements, such as Si, Ge, Sn, S, O, Ti, Zr etc., and preferably Si, Ge and Sn. The p-type semiconductor layer may doped with at least one p-type impurity, such as Be, Zn, Mn, Cr, Mg, Ca etc., and preferably Mg. This allows nitride semiconductor layers of each conductivity type to be formed, and the layers of each conductivity type discussed below to be constituted.

For example, the first semiconductor layer is formed with a multilayer structure on the buffer layer and/or under layer.

A first n-side semiconductor layer can be formed from $Al_dGa_{1-d}N$ ($0\leq d\leq0.5$). This first n-side semiconductor layer is doped with an n-type impurity. The amount of n-type impurity contained in this layer is preferably $5\times10^{17}/cm^3$ to $5\times10^{18}/cm^3$. The thickness of the first n-side semiconductor layer is 0.5 to 10 μm, and preferably 2 to 5 μm. This first n-side semiconductor layer can function as an n-type contact layer or an n-type clad layer. When the first n-side semiconductor layer functions as an n-type contact layer, an n-electrode is formed on the first n-side semiconductor layer in a subsequent step. It is also possible to omit the first n-side semiconductor layer.

A second n-side semiconductor layer is formed on the first n-side semiconductor layer. This second n-side semiconductor layer is silicon-doped $In_gGa_{1-g}N$ ($0.02\leq g\leq0.20$), and preferably $In_gGa_{1-g}N$ in which g is 0.08 to 0.12. This second n-side semiconductor layer effectively prevents the occurrence of cracks in the nitride semiconductor element. The amount of silicon doping is from $5\times10^{17}/cm^3$ to $5\times10^{19}/cm^3$. The thickness of the second n-side semiconductor layer is set so that crystallinity will not be lost, and is 0.10 to 0.20 μm, for example. The second n-side semiconductor layer can also be omitted.

A third n-side semiconductor layer is formed on the second n-side semiconductor layer. The third n-side semiconductor layer may be formed as a single layer, or as a superlattice layer. To form the third n-side semiconductor layer as a superlattice layer, it is preferably constituted by a first layer composed of $Al_aGa_{1-a}N$ ($0 \leq a \leq 0.10$) and a second layer composed of $Al_bGa_{1-b}N$ ($0.01 \leq b \leq 0.14$). The first and second layers can be constituted by laminating layers in which the single-layer thickness is no more than 100 angstroms. Using a superlattice layer such as this allows cracking to be prevented and good crystallinity to be obtained, even though aluminum is contained. The total thickness of the third n-side semiconductor layer is preferably 0.45 to 3.0 μm. The average composition is preferably $Al_eGa_{1-e}N$ ($0.01 \leq e \leq 0.14$). If the average aluminum content is within this range, cracking can be suppressed and a sufficient differential in refractive index can be obtained versus that of the laser waveguide path. The n-type impurity content is preferably from $1\times10^{17}/cm^3$ to $5\times10^{18}/cm^3$. If the n-type impurity content is within this range, resistivity can be lowered and crystallinity will not be lost. The third n-side semiconductor layer can function as an n-side clad layer.

A fourth n-side semiconductor layer is formed on the third n-side semiconductor layer. The fourth n-side semiconductor layer is made of $Al_cGa_{1-c}N$ ($0 \leq c \leq 0.075$), for example. The thickness of the fourth n-side semiconductor layer is from 0.05 to 0.25 μm, and preferably 0.14 to 0.16 μm. Growing the film in this thickness allows the threshold ($I_{th}$) to be lowered without any cracking occurring. The fourth n-side semiconductor layer can function as a wave guide layer. The fourth n-side semiconductor layer can also be omitted.

An active layer is formed on the fourth n-side semiconductor layer. The active layer is made up of a well layer and a barrier layer, and the well layer is preferably composed of $Al_xIn_yGa_{1-x-y}N$ ($0 \leq x \leq 0.05$, $0.005 \leq y \leq 0.25$, $x+y<1$). The barrier layer is preferably composed of $Al_uIn_vGa_{1-u-v}N$ ($0.5 \leq u \leq 0.2$, $0 \leq v \leq 0.15$). For example, the barrier layers are laminated so as to sandwich the well layer, and the barrier layer and well layer are not limited to just one layer, and may instead by two or more layers. More specifically, the active layer may have a multiple quantum well structure in which barrier layers and well layers are repeatedly laminated. The thickness of the well layer and the barrier layer is preferably 50 to 150 angstroms each. The thickness of the first barrier layer is preferably 30 to 250 angstroms, and that of the second barrier layer 30 to 250 angstroms. Forming the active layer in a thickness within this range suppresses the occurrence of cracking near the active layer.

Either the well layer or the barrier layer, or both, may contain an impurity.

A second semiconductor layer is formed in a multilayer structure on the active layer.

A first p-side semiconductor layer can be formed as a carrier confinement layer, an electron confinement layer, a light confinement layer, or the like.

The first p-side semiconductor layer is preferably a nitride semiconductor layer containing aluminum with a higher band gap energy than that of the active layer. A carrier confinement layer may be formed as a single film, or as a multilayer film with different compositions. An example of a p-type carrier confinement layer is a layer of growing one or more layers composed of magnesium-doped $Al_dGa_{1-d}N$ ($0<d\leq 1$). The d is preferably 0.1 to 0.5, and even more preferably 0.15 to 0.35. The thickness of the p-type carrier confinement layer is preferably from 10 to 200 angstroms. If the thickness is within this range, electrons can be confined well within the active layer, and cracking can be suppressed. Also, bulk resistance can be kept low.

A p-type electron confinement layer confines carrier in the active layer or the well layer, prevents overflow of carriers from the active layer as a result of increased current density or higher temperature due to element drive and so forth, and allows carrier to be injected more efficiently into the active layer.

The p-type electron confinement layer usually contains magnesium, the amount of which is $1\times10^{19}/cm^3$ to $1\times10^{21}/cm^3$. If the content is within this range, bulk resistance can be reduced, in addition to which the magnesium can be diffused well in a p-type guide layer grown without doping (discussed below), and the p-type guide layer, which is a thin-film layer, can contain magnesium in an amount of $1\times10^{16}/cm^3$ to $1\times10^{19}/cm^3$. The p-type electron confinement layer is preferably grown at a low temperature, such as the same temperature as the temperature at which the active layer is grown (about 900 to 1000° C.), because this prevents decomposition of the active layer.

The p-type electron confinement layer may be made up of a single film, or may be made up of two layers comprising a layer grown at a low temperature and a layer grown at a high temperature, such as a temperature of about 100° C. higher than the growth temperature of the active layer. It is better overall for this confinement layer to be made up of two layers, because the layer grown at a low temperature prevents the decomposition of the active layer, while the layer grown at a high temperature lowers bulk resistance. There are no particular restrictions on the thickness of each layer when the p-type electron confinement layer is made up of two layers, but the layer grown at a low temperature is preferably 10 to 50 angstroms, and the layer grown at a high temperature 50 to 150 angstroms. The first p-side semiconductor layer can also be omitted.

A second p-side semiconductor layer is formed on the first p-side semiconductor layer. An example of the second p-side semiconductor layer is a nitride semiconductor layer composed of $Al_cGa_{1-c}N$ ($0 \leq c \leq 0.2$). The thickness of a p-type guide layer is preferably 0.05 to 0.25 μm, because within this range the threshold can be kept low. Also, the second p-side semiconductor layer is grown as an undoped layer, but the magnesium contained in the p-type electron confinement layer may be diffused and contained in an amount of $1\times10^{16}/cm^3$ to $1\times10^{18}/cm^3$. The second p-side semiconductor layer can function as a wave guide layer. The second p-side semiconductor layer can also be omitted.

A third p-side semiconductor layer is formed on the second p-side semiconductor layer. The third p-side semiconductor layer may have a single-film structure, but preferably has a multilayer film structure in which nitride semiconductor layers of mutually different compositions are laminated. In the case of the single film structure, an example may be a first layer of $Al_aGa_{1-a}N$ ($0 \leq a \leq 0.50$). In the case of the multilayer film structure, an example is a superlattice layer composed of a first layer of $Al_aGa_{1-a}N$ ($0 \leq a \leq 0.10$) and a second layer of $Al_bGa_{1-b}N$ ($0.05 \leq b \leq 0.14$). The p-type impurity content is preferably $1\times10^{17}/cm^3$ to $1\times10^{20}/cm^3$. If the p-type impurity is contained within this range, it will not result in a loss of crystallinity, and bulk resistance can be reduced. This multilayer film preferably has a single-layer film thickness of 100 angstroms or less.

If the third p-side semiconductor layer is formed with a superlattice structure, the occurrence of cracking can be suppressed. The total thickness of the third p-side semiconductor layer is 0.4 to 0.55 μm; within this thickness range the forward voltage (Vf) can be reduced. The average overall content of aluminum in the third p-side semiconductor layer is from 0.01 to 0.14. Within this range, the occurrence of cracking can be suppressed, and a sufficient differential in refractive index can be obtained versus that of the laser waveguide path. This third p-side semiconductor layer has a larger band gap than the active layer, and usually functions as a p-side clad layer, but at the same time it may function as a p-side contact layer. This allows the fourth p-side semiconductor layer that would otherwise be formed later to be omitted.

A fourth p-side semiconductor layer is formed on the third p-side semiconductor layer. The fourth p-side semiconductor layer is preferably produced by growing a nitride semiconductor layer composed of GaN doping magnesium. The thickness is favorably about 10 to 200 angstroms. The magnesium content is $1\times10^{19}/cm^3$ to $1\times10^{22}/cm^3$. Thus adjusting the film thickness and the magnesium content raises the carrier concentration in the p-type contact layer and produces lower ohmic contact resistance with the p-electrode discussed below. As mentioned above, the fourth p-side semiconductor layer can also be omitted.

Recessed and Raised Portions

Recessed and raised portions are periodically provided in the first semiconductor layer and/or second semiconductor layer of the present invention, affording the function of diffraction grating. In this Specification, the recessed and raised portions in the semiconductor layers will sometimes be called diffraction grating.

When recessed and raised portions are formed in the first semiconductor layer, they are formed in the third n-side semiconductor layer (n-side clad layer), for example, and the recessed and raised portions can be embedded with the fourth n-side semiconductor layer in order to be flat its surface. Alternatively, a third n-side semiconductor layer (n-side clad layer) composed of a multilayer structure of different compositions may be provided, recessed and raised portions formed in the lower layer portion of the third n-side semiconductor layer (n-side clad layer), and the recessed and raised portions embedded in the upper layer of the third n-side semiconductor layer in order to be flat its surface. When recessed and raised portions are formed in the second semiconductor layer, they are preferably formed in the second p-side semiconductor layer (p-side guide layer), for example, and embedded with the third p-side semiconductor layer (p clad layer). From a different standpoint, the recessed and raised portions are preferably formed near the active layer, and for example, are preferably formed such that the shortest distance from the recessed and raised portions to the active layer (see D in FIG. 2) is about 200 nm or less, and more preferably about 100 nm or less, and even more preferably about 50 nm or less, or about the height of the recessed and raised portions or less.

There are no particular restrictions on the shape of the recessed and raised portions, but examples include a sawtooth shape, sine wave shape, rectangular shape, trapezoidal shape, and inverse trapezoidal shape, but a rectangular, trapezoidal, inverse trapezoidal, or other such shape is preferable. That is, it is preferable to use a shape in which the side faces of the raised portions that make up a diffraction grating match the normal direction of the substrate, or a shape having a slope of from $\alpha=30°$ (trapezoid shape, see FIG. 5a, or a shape close to this, with the side faces bulging out) to $\beta=-30°$ (inverse trapezoid shape, see FIG. 5b, or a shape close to this, with the side faces sunken in) with respect to the normal direction of the substrate, and more preferably $\alpha=20°$ to $\beta=-30°$, $\alpha=10°$ to $\beta=-30°$, $\alpha=5°$ to $\beta=-30°$, $\alpha=30°$ to $\beta=-20°$, $\alpha=30°$ to $\beta=-10°$, $\alpha=30°$ to $\beta=-5°$, $\alpha=20°$ to $\beta=-20°$, $\alpha=10°$ to $\beta=-10°$.

There are no particular restrictions on the size of the diffraction grating, which can be suitably adjusted according to wavelength of the laser beam to be obtained, the composition of the nitride semiconductor layers being used, and so forth. The period (pitch) of the recessed and raised portions is determined by the effective refractive index and the desired oscillation wavelength, and can be ascertained from $\lambda/2n$ ($\lambda$=wavelength, n=the effective refractive index of semiconductor). The period of the recessed and raised portions may also be an integer multiple of the value obtained from $\lambda/2n$ ($\lambda$=wavelength, n=the effective refractive index of semiconductor). For instance, if a nitride semiconductor laser element with an oscillation wavelength of 400 nm is to be formed, the recessed and raised portions may be formed at a period of 400 nm (wavelength)/[2×2.5 (the effective refractive index of semiconductor)]=80 nm. The pitch of the recessed and raised portion width (one period of recessed and raised portions) is preferably about 40 to 400 nm, and more preferably about 40 to 140 nm when it is a first order diffraction grating. Also, the pitch of the diffractive grating within this range makes it possible to form the flat surface of the semiconductor layer that embeds the recessed and raised portions. The recessed portions and raised portions preferably have the same width, but the widths may be different. From another standpoint, the width of the raised portions and the width of the recessed portions are preferably within a range of about 1/15 to 8 times the height of the raised portions (discussed below).

The depth of the diffraction grating (height of the recessed and raised portions) is about 300 nm or less, and preferably about 50 to 300 nm.

Restricting the size and depth in this way allows a region with the desired high aluminum mixed crystal ratio (discussed below) to be disposed and formed at the proper location. Setting the pitch of the recessed and raised portion width of the diffraction grating (one period of the recessed and raised portions) within the above range allows the semiconductor layer that embeds the recessed and raised portions to be made flat so as not to assume any recessed and raised portions, or to be formed so that there is no adverse effect on laser oscillation.

There are no particular restrictions on the method for forming the recessed and raised portions in the first semiconductor layer and/or second semiconductor layer, but as an example, they can be formed by forming a mask pattern by a photolithography or etching process utilizing a method known in this field, such as a double resist method (by using negative and positive photoresists and employing one-step holographic exposure), contact mask exposure, electron beam lithography, or a phase shift method, and then using this mask pattern as a mask in etching.

The mask pattern here can be formed using a single film or multilayer film of a metal such as nickel or chromium, an oxide film or nitride film such as $Al_2O_3$, $ZrO_2$, $SiO_2$, $TiO_2$, $Ta_2O_5$, AlN, or SiN, or a variety of resists. These are preferably formed in a thickness of about 10 to 500 nm, for example. This makes it possible to form the raised portions of the diffraction grating at the desired height.

Also, when the recessed and raised portions are formed by etching a semiconductor layer using a mask pattern, the etching may be either dry etching or wet etching with a suitable etchant. For instance, when dry etching is used, the etching is preferably performed at a pressure of between 0.05 and 10 Pa (constant pressure or suitably varied pressure). This allows etching to the desired depth to be carried out more efficiently.

A region with a higher aluminum mixed crystal ratio than that of the semiconductor layer that embeds the recessed and raised portions may be disposed on the raised portion top faces that constitute the diffraction grating, or a region with a higher aluminum mixed crystal ratio than that of the semiconductor layer in which the recessed and raised portions are formed and/or the semiconductor layer that embeds the recessed and raised portions may be disposed between the raised portions and the semiconductor layer that embeds the recessed and raised portions. This region is constituted by a nitride semiconductor containing aluminum, and is preferably composed of $Al_fGa_{1-f}N$ ($0 \leq f \leq 1$). This region with a higher aluminum mixed crystal ratio is preferably formed as part of the layer that embeds the recessed and raised portions. This allows refractive index differential between the recessed and raised portions to increase, and thus a sufficient effect of the diffraction grating can be obtained Furthermore, when the semiconductor layer disposed on this (the one that embeds the recessed and raised portions) is formed by a superlattice layer, its average aluminum content is preferably higher than that of the superlattice layer. There are no particular restrictions on the shape of the region with the higher aluminum mixed crystal ratio, but the shapes shown in FIGS. 8a to 8g can be used, for example. This region is preferably disposed over the entire raised portion top faces of the diffraction grating see (FIG. 2 and FIGS. 8a to 8c and 8f), but the region may be omitted from part of a single raised portion or from some of the raised portions (see FIGS. 8d, 8e, and 8g), or may have a shape that overhangs the side faces of the raised portions (see FIG. 8f). In particular, if the region with a higher aluminum mixed crystal ratio has an tapered shape as in FIGS. 8b, 8c, and 8e, there will be less cracking and the like in the formation of the semiconductor layer that embeds the recessed and raised portions, and the recessed and raised portions can be embedded without any voids or the like being formed. In this case, it is preferable for the top faces of the region with a higher aluminum mixed crystal ratio to be flat as in FIG. 8b because the semiconductor layer that embeds the recessed and raised portions and the layers formed thereon can be obtained flat surface.

Figure 8A:
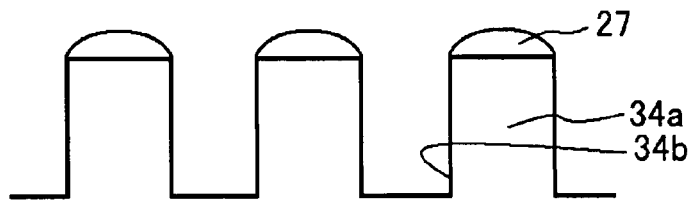
FIGS. 8a to 8g are simplified cross sections illustrating diffraction grating in another aspect of the laser element of the present invention.
Figure 8B:
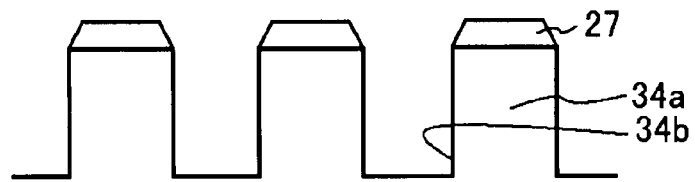
Figure 8C:
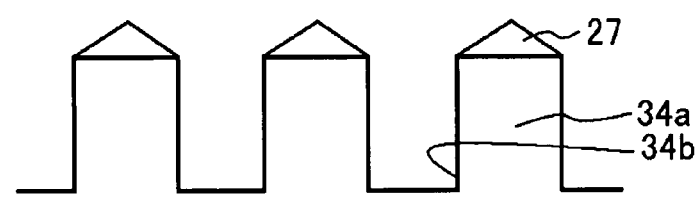
Figure 8D:
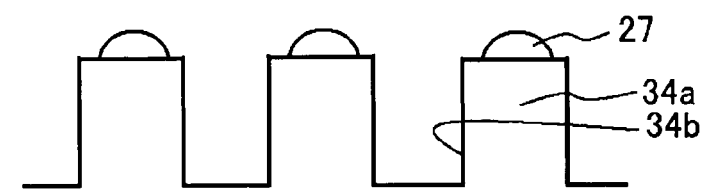
Figure 8E:
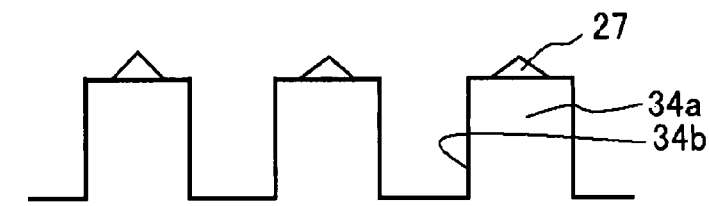
Figure 8F:
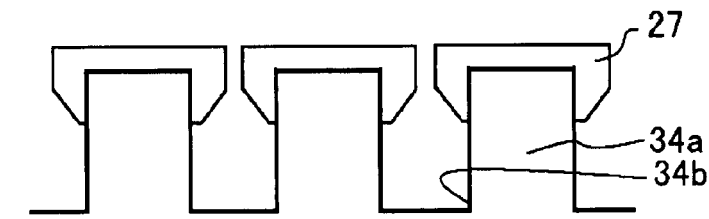
Figure 8G:
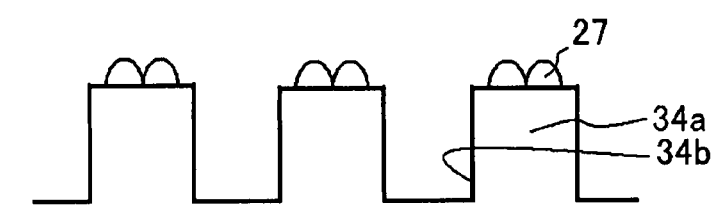

Also, as discussed below, if a semiconductor layer with a high aluminum content is laminated over the semiconductor layer where the diffraction grating is to be formed, and a mask formed over this is used to etch the semiconductor layer with the high aluminum content and the semiconductor layer where the diffraction grating is to be formed, then a region with a higher aluminum mixed crystal ratio can be formed in the shape shown in FIG. 8b, the occurrence of dislocations and abnormal growth from this region can be suppressed, and the recessed and raised portions can be easily flattened.

It is also possible to process the region with a higher aluminum mixed crystal ratio as desired by performing wet etching after the region with a higher aluminum mixed crystal ratio has been formed. For instance, FIG. 8a can be formed as in FIG. 8d, and FIG. 8c can be formed as in FIG. 8e.

It is also possible for there to be a sloped face that is contiguous from the top face to the side face of a raised portion, and when there is such a sloped face, the region with a higher aluminum mixed crystal ratio may be formed from the sloped face all the way to the top face of the raised portion.

There are no particular restrictions on the thickness of the region with the higher aluminum mixed crystal ratio, but an example is about 50 nm or less, and about 1 to 50 nm is preferable. It is favorable for the aluminum content of the region with the higher aluminum mixed crystal ratio to be about 0.01 to 0.25 higher than that of the semiconductor layer where the recessed and raised portions are formed and/or the semiconductor layer that embeds the recessed and raised portions, for example. It is more preferable to set the content within a range of about 0.1 to 0.25.

An example of the method for forming this region with a higher aluminum mixed crystal ratio is one in which a semiconductor layer with a high aluminum content is laminated in a specific film thickness over the semiconductor layer where the diffraction grating is to be formed, prior to the formation of the above-mentioned diffraction grating, the above-mentioned mask pattern is formed on this, this mask pattern is used as a mask to etch the semiconductor layer with a high aluminum content, and diffraction grating is formed by etching the semiconductor layer where the diffraction grating is to be formed.

Also, after the semiconductor layer with a high aluminum content has been patterned using the above-mentioned mask pattern, the mask pattern may be removed and the resulting layer with a high aluminum content may be used as a mask to form diffraction grating by etching. Alternatively, patterning may be performed using a mask pattern containing Al, such as $Al_2O_3$, AlN, or the like, and a layer that flattens out the recessed and raised portions may be grown without first removing this mask pattern.

Furthermore, a region with a high aluminum content can be formed on the top faces of the raised portions by first forming the diffraction grating and then laminating a semiconductor layer with a high aluminum content under suitably adjusted conditions for pressure, temperature, raw material gas, and so forth.

Also, this region can be formed by first forming the diffraction grating and then laminating two or more kinds of semiconductor layer with different aluminum contents under suitably adjusted conditions for pressure, temperature, type and flux of raw material gas, and so forth to create a superlattice structure. Furthermore, in forming each of the layers of the superlattice structure, there may be a pause of about 5 seconds between film formations, or the ratio of the flux of raw material gas containing nitrogen atoms to the flux of raw material gas containing Group III element atoms may be set to about 2000 or higher, or in forming the semiconductor layer with a high aluminum content, the film may be formed with the pressure adjusted to normal pressure, or a combination of these conditions may be employed.

A region with a higher aluminum content than that of the nitride semiconductor layer formed on the raised portions is preferably disposed on part of the side faces of the raised portions that make up the diffraction grating. It is preferable for the region of high aluminum content formed on the raised portion side faces to have about the same aluminum content as that of the region of high aluminum content formed on the raised portion top faces, but this region on the side faces does not necessarily have to be the same as that of the aluminum content of the region formed on the raised portion top faces. There are no particular restrictions on the thickness or length of the region of high aluminum content on the raised portion side faces, but examples include about 50 nm or less and about 200 nm or less, respectively. It is favorable if the region of high aluminum content formed on the raised portion side faces does not cover the entire side face, and is not in contact with the bottom faces of the recessed portions.

Figure 5A:
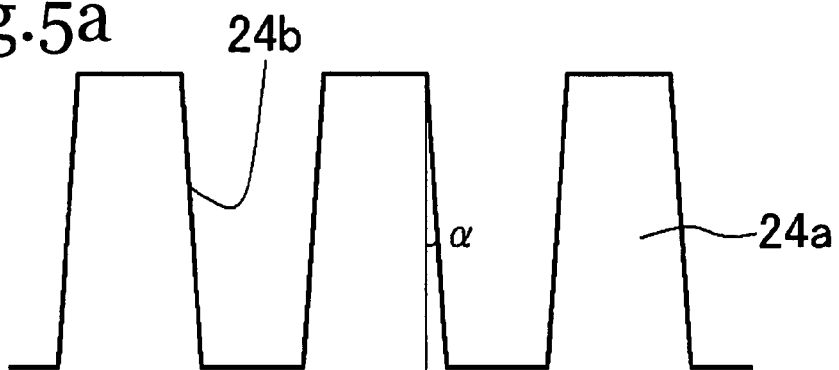
FIGS. 5a and 5b are simplified cross sections illustrating diffraction grating in another aspect of the laser element of the present invention.
Figure 5B:
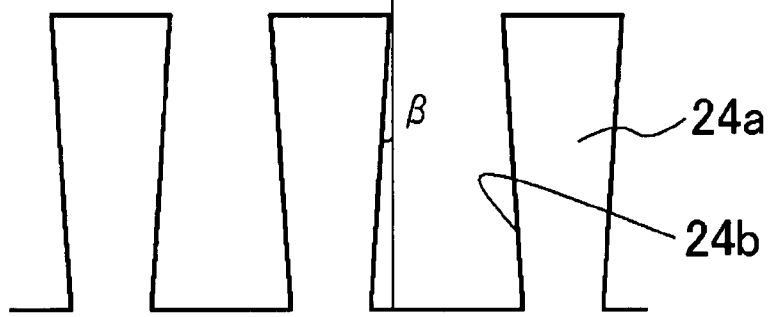
Figure 6A:
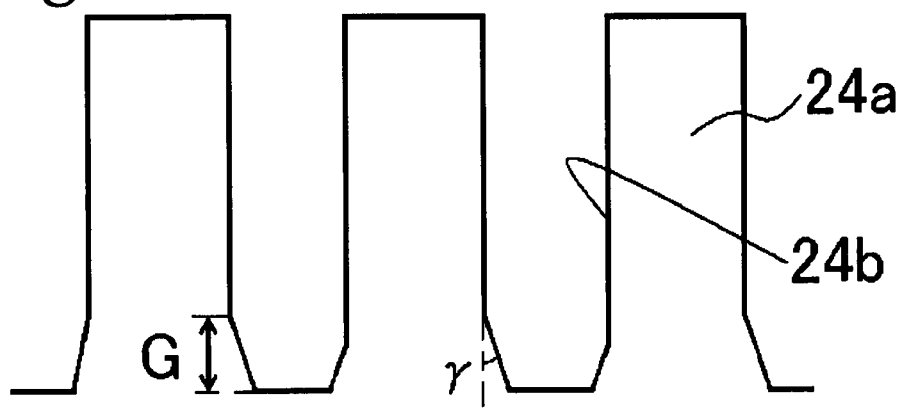
FIGS. 6a and 6b are simplified cross sections illustrating diffraction grating in another aspect of the laser element of the present invention.
Figure 6B:
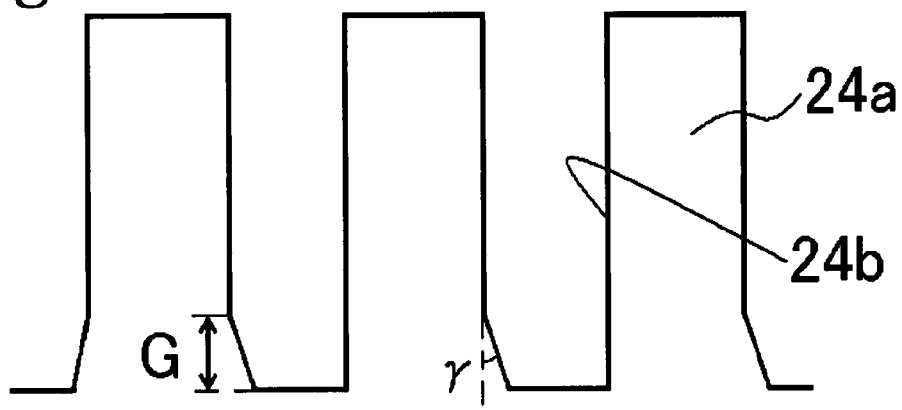
Figure 7A:
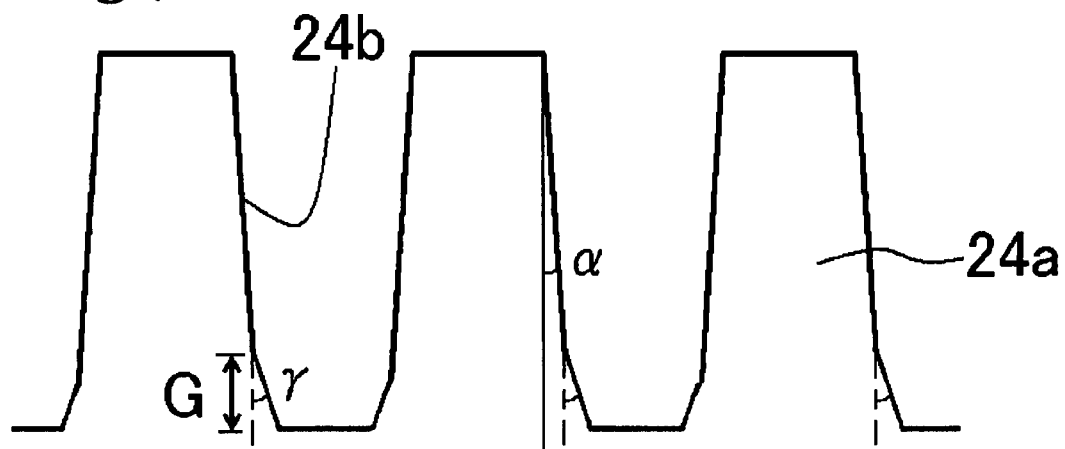
FIGS. 7a and 7b are simplified cross sections illustrating diffraction grating in another aspect of the laser element of the present invention.
Figure 7B:
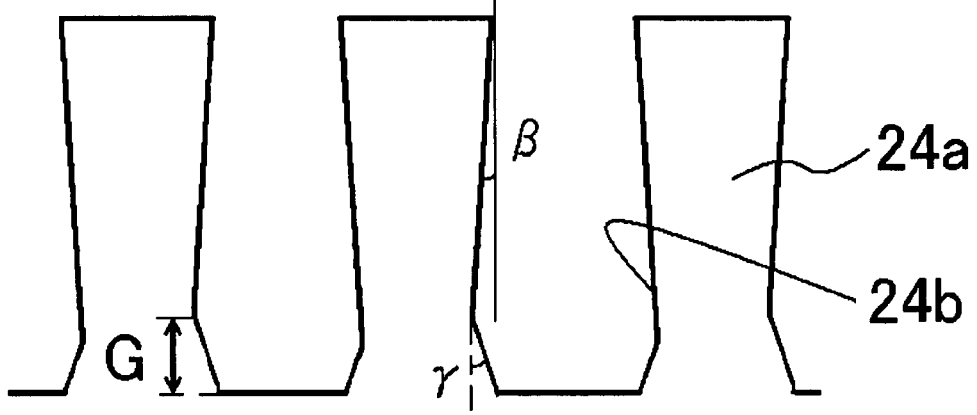

Furthermore, as shown in FIG. 6, the bottom side faces of the recessed portions that make up the diffraction grating preferably have sloped faces that are contiguous from the side faces of the raised portions to the recessed portion bottom faces at a length G that is from ½ to 1/10 the height H of the recessed and raised portions that make up the diffraction grating. This sloped face may be formed on both side faces of the raised portion, but may be left out on both side faces of some of the raised portions or on one side face of some of the raised portions (see FIG. 6b). Also, if the side faces of a recessed portion are sloped as shown in FIGS. 5a and 5b, then as shown in FIG. 7, the sloped face is preferably formed at a slope angle γ that can be distinguished from this slope of the side faces. Furthermore, the sloped faces need not all be formed at the same slope and height, and the slope angle and/or the height may be different for some or all of the side faces. More specifically, the length G of the slope may be about 5 to 150 nm, for example. The slope angle γ is preferably within a range of 20 to 70° with respect to the normal direction of the substrate or with respect to the recessed portion side faces. If the side faces near the bottom part of the recessed portions of the diffraction grating are thus sloped, the recessed portions can be completely filled in, without forming any voids in the recessed portions, during regrowth of a semiconductor layer on the diffraction grating. As a result, the surface of the semiconductor layer formed over the diffraction grating can be made flat, and an increase in voltage in the laser element, disturbance of the diffraction grating, and so forth can be prevented.

Also, the junctions between the side faces and sloped faces, and the junctions between the sloped faces and the bottom faces do not necessarily have to be formed so as to form an angle, and the corners may be rounded. In particular, if the pitch of the recessed and raised portions is large (such as 200 nm or greater), there will be a tendency toward rounding at the junctions between the side faces and sloped faces, and the junctions between the sloped faces and the bottom faces.

Examples of methods for sloping the side faces near the bottom side faces of the recessed portions include a method in which the above-mentioned single-film or multilayer film mask is formed on the layer where the diffraction grating is to be formed, and this mask is used for dry etching while the etching pressure is varied between 0.05 and 10 Pa, for example; and a method in which wet or dry etching is performed while the type or composition of etchant is varied. Another example is a method in which the mask material used to form the diffraction grating has a structure comprising two or more layers, with a material having low selectivity for a resist is used for the lower layer, and a material having a high selectivity for a resist is used for the upper layer, a pattern corresponding to the diffraction grating is transferred from a resist to this mask material, and this mask with a two or more layer structure is used to form diffraction grating by etching.

Also, with the present invention, when the recessed and raised portions are formed in the first semiconductor layer, the distance from the raised portion top faces of the recessed and raised portions to the active layer is preferably no more than 3 times the height of the recessed and raised portions. From another standpoint, it is preferable if the distance D from the raised portion top faces to the active layer is no more than 3 times the pitch width of the recessed and raised portions. Keeping this distance within the above range allows single-mode oscillation. Also, this distance D is preferably at least 0.5 times the height of the recessed and raised portions, because this flattens out the surface of the semiconductor layer formed over the recessed and raised portions. From yet another standpoint, the recessed and raised portions are preferably formed close to the active layer, and for example, are preferably formed such that the shortest distance from the recessed and raised portions to the active layer is about 300 nm or less, and more preferably about 100 nm or less, and even more preferably about 50 nm or less, or about the height of the recessed and raised portions or less.

Thus restricting the size and depth of the recessed and raised portions and of the semiconductor layer that embeds the recessed and raised portions allows the recessed and raised portions to be formed at high precision and at the same time allows the surface of the first semiconductor layer that embeds the recessed and raised portions to be made flat, and this in turn allows good characteristics of the active layer formed thereover to be maintained or improved. As a result, the top faces of the diffraction grating are flat and the original performance of the laser element is maintained or improved, and at the same time the effect of the diffraction grating can be sufficiently exhibited, and the threshold current can be lowered.

Also, when the recessed and raised portions are formed at a specific pitch, and are formed at a varied ratio of width of the recessed portions and raised portions, there is a tendency that the embedding semiconductor layer can be formed thinner as the width of the recessed portions increases.

Ridge

After a nitride semiconductor laser element has been formed, ridge is formed on the surface of the second semiconductor layer.

For example, a protective film composed of a silicon oxide (mainly $SiO_2$) is formed in a thickness of about 0.5 μm with a CVD apparatus over substantially the entire surface of the uppermost fourth p-side semiconductor layer (p-side contact layer), after which a mask is formed in a specific shape on the protective film, and a striped protective film is formed by photolithography and by an RIE apparatus using $CHF_3$ gas or the like. Using this protective film as a mask, the semiconductor layer is etched with $SiCl_4$ gas, for example, to form ridge. The ridge is usually etched from the fourth p-side semiconductor layer, and are preferably formed above the active layer. It is preferable for the shape of this ridge to be that of stripe. For example, stripe can be obtained by etching from the p-side contact layer to part-way through the p-side guide layer. In the present invention, when recessed and raised portions are provided to a p-side semiconductor layer, ridge may be formed above the recessed and raised portions, or ridge may be formed by halting the etching midway through the recessed and raised portions, or ridge may be formed by etching to below the recessed and raised portions. If the ridge is formed by etching to below the recessed and raised portions, the structure will have recessed and raised portions under the ridge. The width of the ridge is 0.5 to 15 μm, and preferably 1.0 to 5.0 μM.

Ridge do not necessarily have to be formed with the nitride semiconductor laser element of the present invention, and a semiconductor laser element may have a current constriction layer formed on a nitride semiconductor layer.

Electrodes

A p-electrode is formed by sputtering over a p-type contact layer. A p-electrode preferably has a structure comprising numerous metal layers, for instance, a specific example of which is an electrode material such as one based on Ni—Au, Ni—Au—Pt, Pd—Pt, Ni—Pt, Pt—Pd—Ti, Pt—Rh, ITO.

Also, an ohmic n-electrode is formed on the top face of an n-type contact layer. The n-electrode is composed of an electrode material based on Ti—Al, V—Pt, W—Pt, Ti—Al—Ti—Pt, W—Al—W, Ti—Mo—Ti—Pt or the like, and is formed as stripe that is parallel to the ridge and is about the same length. The n-electrode does not necessarily have to be formed on the top face of the n-type contact layer, and may instead be formed on the bottom face side of the substrate (the opposite side from the element structure) as long as the substrate being used is conductive and ohmic contact can be ensured.

Further, a pair of cavity facet is usually formed in the nitride semiconductor laser element of the present invention. An insulating film may be formed on the cavity face, the ridge or the like, or a pad electrode or the like may be formed on each electrode.

Also, as another aspect of the present invention, the nitride semiconductor laser element may be such that when the recessed and raised portions are formed in the second semiconductor layer, they are formed as stripes extending perpendicular to the cavity facets, within the second semiconductor layer are formed a first region and a second region that is formed on both sides of the first region, the width of the recessed portions and/or the raised portions in the first region is formed different from the width of the recessed portions and/or the raised portions in the second region, and a differential is imparted to the refractive index and/or conductivity between the first and second regions.

With a nitride semiconductor laser element such as this, optical confinement can be achieved in the lateral direction, without being dependent on just the ridge depth, the ridge width, or the protective film formed on both sides of the ridges. Also, the aspect ratio can be stabilized between the spreading width of the laser beam in the lateral direction and the spreading width in the longitudinal direction. Also, with this nitride semiconductor laser element, current constriction and optical confinement in the lateral direction can both be accomplished without forming ridges. Furthermore, since no selective growth is performed using a mask, abnormal growth can be suppressed at the semiconductor layer lamination stage, which gives a higher manufacturing yield and improves mass productivity.

Examples of the nitride semiconductor laser element of the present invention will now be described in detail through reference to the drawings.

Example 1

As shown in FIG. 1a, for example, the nitride semiconductor laser element comprises a substrate 11, a first semiconductor layer 12 (such as an n-type), an active layer 13, and a second semiconductor layer 14 (such as a p-type). This laser element further comprises a first electrode (not shown) and a second electrode (not shown) that are electrically connected to the first semiconductor layer 12 and the second semiconductor layer 14, respectively, a first protective layer (insulator) 15 is formed on the second semiconductor layer 14, and a second protective layer 16 (see FIG. 1b) is formed on a cavity facet.

A different type of substrate, composed of sapphire, is used as the substrate 11, and an under layer produced by lateral growth is formed on this via a buffer layer (not shown).

The compositions and thicknesses of the first semiconductor layer 12, the active layer 13 and the second semiconductor layer 14 are shown in Table 1.

TABLE 1

| | |
|---|---|
| p-Contact Layer | GaN: 15 nm (Mg doped) |
| p-Clad Layer | (AlGaN: 2.5 nm/Mg doped GaN: 2.5 nm) superlattice layer (average Al mixed crystal ratio 0.049): 470 nm |
| p-Wave Guide Layer | GaN: 150 nm |
| p-Cap Layer | $Al_{0.25}Ga_{0.75}N$: 10 nm |
| Active Layer (MQW) | Topmost barrier layer $In_{0.02}Ga_{0.98}N$: 14 nm |
| | Barrier layer $In_{0.02}Ga_{0.98}N$(Si doped): 14 nm |
| | Well layer $In_{0.11}Ga_{0.89}N$: 7 nm |
| | 1st barrier layer $In_{0.02}Ga_{0.98}N$: 14 nm |
| n-Wave Guide Layer | GaN: 170 nm |
| n-Clad Layer | (AlGaN: 2.5 nm/Si doped GaN: 2.5 nm) superlattice layer (average Al mixed crystal ratio 0.036): 1300 nm |
| n-Crack Preventing Layer | $In_{0.06}Ga_{0.94}N$ (Si doped): 150 nm |
| n-Contact Layer | $Al_{0.02}Ga_{0.98}N$ (Si doped): 3500 nm |
| AlGaN Buffer Layer | n-$Al_{0.02}Ga_{0.98}N$: 1000 nm |

This nitride semiconductor laser has a structure shown in Table 2.

TABLE 2

| | |
|---|---|
| Ridge Width | 2 μm |
| Cavity Length | 300 μm |
| Protective Film | $SiO_2$: 500 nm |
| Insulator | $ZrO_2$: 100 nm |
| p-Electrode | Ni: 10 nm/Au: 150 nm |
| n-Electrode | Ti: 10 nm/Al: 550 nm |
| p-Pad Electrode | Ni: 100 nm/Ti: 100 nm/Au: 800 nm |
| n-Pad Electrode | Ni: 100 nm/Ti: 100 nm/Au: 800 nm |

Figure 1B:
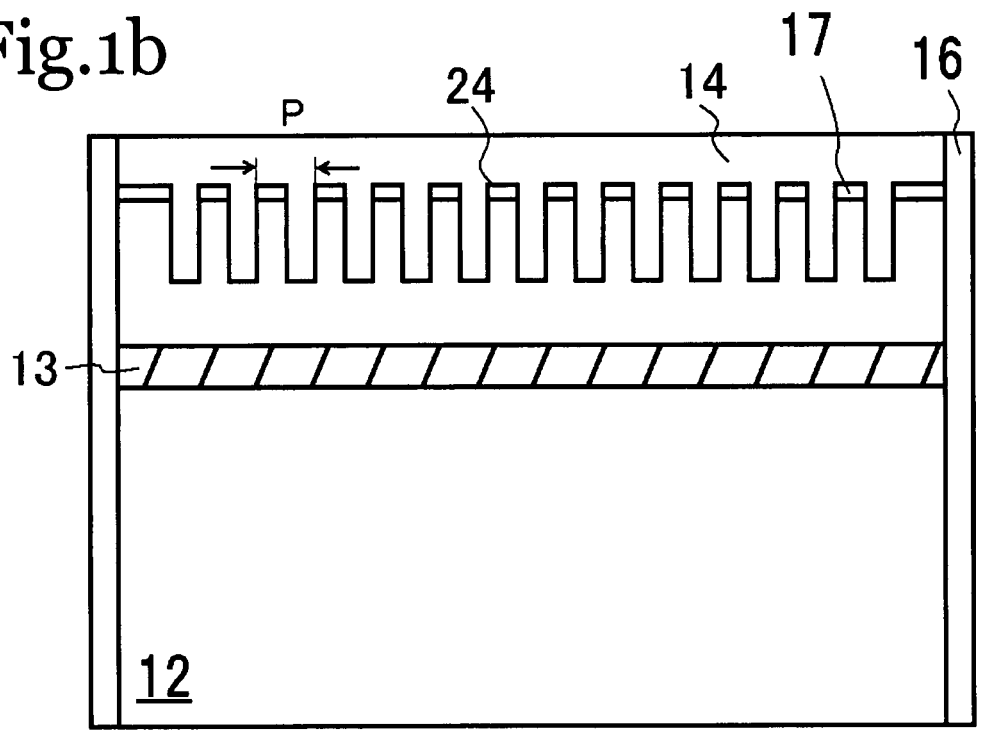
Figure 2:
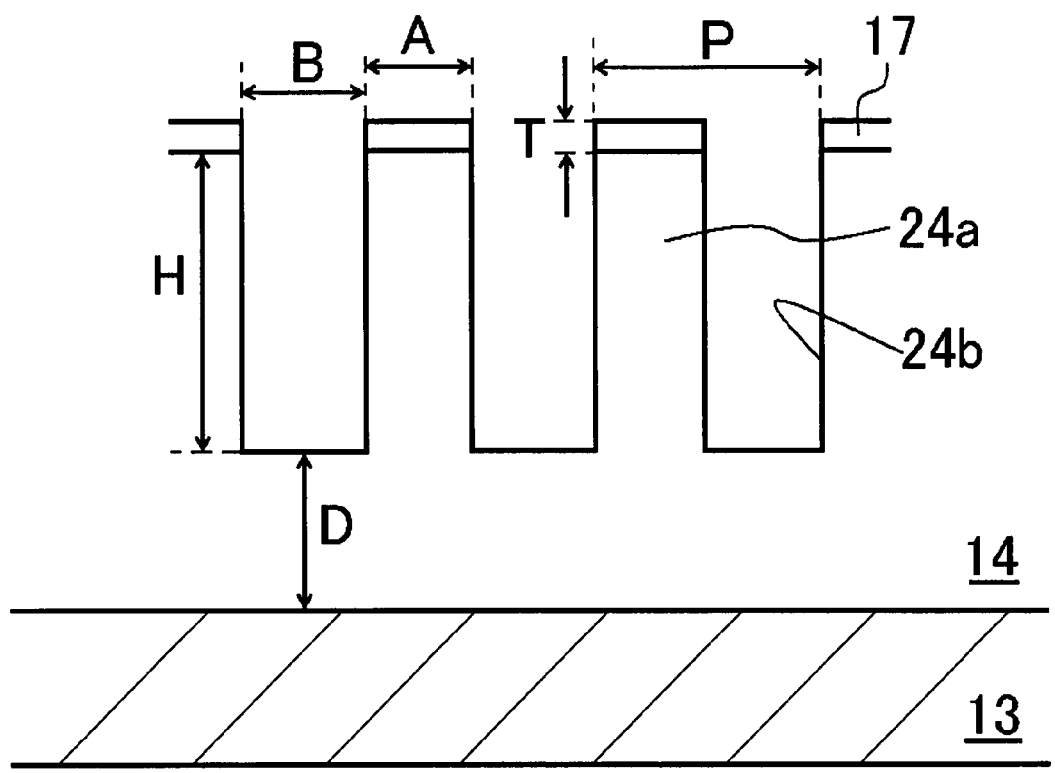
FIG. 2 is a simplified cross section illustrating the recessed and raised portions in the laser element of the present invention.

As shown in FIG. 1b, this laser element has a diffraction grating 24 formed in a wave guide layer within the second semiconductor layer 14. A region 17 with a high aluminum content and composed of AlGaN mixed crystal with an aluminum content of 0.15 is formed on the top faces of the diffraction grating 24. As shown in FIGS. 1b and 2, this diffraction grating 24 has a pitch P of 80 nm, the width A of the raised portions 24a is 40 nm, the width B of the recessed portions 24b is 40 nm, the height H of the recessed and raised portions is 100 nm, the distance D from the active layer 13 is 50 nm, and the thickness T of the region 17 with a high aluminum content is 35 nm.

This laser element is manufactured as follows.

First, a sapphire substrate is provided as different type of substrate.

The substrate is set into a reaction chamber, a low temperature grown buffer layer composed of $Al_{0.02}Ga_{0.98}N$ (15 nm thick) is grown on the sapphire substrate using hydrogen gas for career gas, and ammonia ($NH_3$) and TMG (trimethylgallium) for the raw material gas with the temperature set to 510° C.

On the obtained buffer layer, an n-type contact layer composed of n-$Al_{0.02}Ga_{0.98}N$ (3.5 μm thick) is laminated using TMG, TMA (trimethylaluminum) and ammonia for the raw material, and silane gas for an impurity gas.

Next, the temperature is set to 920° C., a crack preventing layer composed of $In_{0.06}Ga_{0.94}N$ doped with Si at $5\times10^{18}/cm^3$ (0.15 μm thick) is grown using TMG, TMI (trimethylindium) and ammonia.

The temperature is set to 1000° C., and an A layer composed of undoped $Al_{0.08}Ga_{0.92}N$ (25 Å thick) is grown using TMA, TMG, and ammonia for the raw material, and then a B layer composed of GaN doped with Si at $5\times10^{18}/cm^3$ (25 Å thick) is laminated using a silane gas for an impurity gas. The A layer and the B layer are alternately laminated over a substrate, and this process is repeated 260 times to grow an n-type clad layer composed of a multilayer film (superlattice structure) with a total thickness of 1.3 μm. The average aluminum content of this clad layer is 0.036.

An n-side wave guide layer composed of GaN is grown on the clad layer using TMG and ammonia for the raw material at the same temperature.

Next, a first barrier layer composed of silicon-doped $In_{0.02}Ga_{0.98}N$ and a well layer composed of undoped $In_{0.11}Ga_{0.89}N$ are laminated in two pairs using TMG and TMI for the raw material gas and with the temperature set at 900° C., and on this is laminated a second barrier layer composed of undoped $In_{0.02}Ga_{0.98}N$ to form an active layer. The first barrier layer is 140 Å, the second barrier layer 140 Å, and the well layer 70 Å/barrier layer 140 Å, forming a quantum well structure with a total thickness of approximately 560 Å.

An p-side first cap layer composed of $Al_{0.25}Ga_{0.75}N$ doped with Mg at $1\times10^{19}/cm^3$ (30 Å thick) is grown on the active layer using TMA, TMG and ammonia for the raw material, and $Cp_2Mg$ (bis-cyclopentadienyl magnesium) for an impurity gas at the same temperature, and then an p-side second cap layer composed of $Al_{0.25}Ga_{0.75}N$ doped with Mg at $1\times10^{19}/cm^3$ (70 Å thick) is grown.

Next, the temperature is set to 1000° C., and a p-side wave guide layer composed of GaN (0.15 μm thick) is grown using TMG and ammonia. This p-side wave guide layer is undoped layer, but magnesium may be included by diffusion from an adjacent layer, such as the p-type cap layer and the p-type clad layer discussed below. Magnesium may also be intentionally doped.

Then, a layer composed of undoped $Al_{0.20}Ga_{0.80}N$ is grown to a thickness of 35 nm at 1000° C. to form a layer with a high aluminum mixed crystal ratio. This layer is undoped layer, but magnesium may be included by diffusion from an adjacent layer, such as the p-type clad layer discussed below. Magnesium may also be intentionally doped.

An $SiO_2$ film (200 nm thick) is formed over this layer, and on this is formed a resist layer (200 nm thick). Using electron beam lithography, a pattern corresponding to diffraction grating is formed in the resist layer. This resist pattern is used as a mask to transfer the pattern to the $SiO_2$ film, and then the $SiO_2$ film and resist layer thus patterned are used as a mask to dig down 135 nm into the p-type wave guide layer and the layer with a high aluminum mixed crystal ratio by RIE, with the pressure suitably adjusted to a range of 0.05 to 10 Pa, for example. The result of this is that the diffraction grating of this Example and a region of a high aluminum mixed crystal ratio are formed.

After the mask pattern is removed, an A layer composed of undoped $Al_{0.13}Ga_{0.87}N$ is formed in a thickness of 25 Å at 1000° C., and B layer composed of magnesium-doped GaN is grown to a thickness of 25 Å using $Cp_2Mg$, with the raw material gas flux, pressure, and other conditions adjusted. The process of alternately laminating the A layer and B layer is repeated 94 times to grow a p-type clad layer composed of a superlattice layer with a total thickness of 0.47 μm.

This allows a region with a high aluminum content to be disposed over the raised portions that make up the diffraction grating, and allows a p-type clad layer to be grown flat over the diffraction grating.

Finally, a p-type contact layer composed of p-type GaN and doped with $1\times10^{20}/cm^3$ magnesium is grown to a thickness of 150 Å on the p-type clad layer. The p-type contact layer can be constituted by p-type $In_XAl_YGa_{1-X-Y}N$ ($0\leq X$, $0\leq Y$, $X+Y\leq1$), and preferably GaN doped with a p-type impurity or AlGaN with an aluminum content of 0.3 or less, which yields the most favorable ohmic contact with a p-electrode. Since an-electrode is formed over the p-type contact layer, the carrier concentration is preferably high, at least $1\times10^{17}/cm^3$.

After this, the wafer is annealed in a reaction chamber in a nitrogen atmosphere and at a temperature of about 700° C. so as to lower the resistance of the p-type semiconductor layer.

After a laminated structure is formed by thus growing nitride semiconductors, the wafer is taken out of the reaction chamber, and an etching mask composed of $SiO_2$ is formed on the surface of the p-type contact layer (the uppermost layer). This mask is patterned into a specific shape, and the p-type semiconductor layer, the active layer, and part of the n-type semiconductor layer are successively etched by RIE (reactive ion etching) using $Cl_2$ gas, thereby exposing the surface of the n-type contact layer on which an n-electrode is formed. A cavity face (1-100 plane; the face corresponding to the side face of a hexagonal prismatic crystal=M plane) is formed at the same time by this etching. The surface of the n-type contact layer may be exposed not only in the region where the n-electrode is formed, but also at the locations where the nitride semiconductor element is split in a subsequent step, and/or in the region surrounding these locations.

Next, ridge stripe is formed as the above-mentioned striped waveguide region. First, a first protective film composed of a silicon oxide (mainly $SiO_2$) is formed in a thickness of 0.5 μm with a CVD apparatus over substantially the entire surface of the p-type contact layer (upper contact layer) that is the uppermost layer. Then, a mask of a specific shape is formed over the first protective film, and the first protective film is given a stripe width of 2 μm by photolithography and by an RIE apparatus using $CF_4$ gas. The first protective film is then used as a mask to etch the p-type contact layer, the p-type clad layer, and part of the p-type wave guide layer, etching down to a depth at which the thickness of the p-type wave guide layer is 0.1 μm, to form ridge stripe.

After the formation of the ridge stripe, an insulator composed of a zirconium oxide (mainly $ZrO_2$) is formed contiguously in a thickness of 100 nm over the first protective film and over the p-type wave guide layer exposed by etching.

After the formation of the protective film, the wafer is heat treated at 600° C. When a material other than $SiO_2$ is thus formed as a second protective film, heat treatment at 300° C. or higher but below the decomposition temperature (1200° C.) of the nitride semiconductor after the formation of the protective film makes the insulator less likely to dissolve in the first protective film dissolution material (hydrofluoric acid), so adding this step is even more desirable.

Next, the wafer is immersed in hydrofluoric acid, and the first protective film is removed by lift-off method. As a result, the first protective film that had been provided over the p-type contact layer is removed and the p-type contact layer is exposed. As shown in FIG. 1, through the above process an insulator was formed on the side faces of the ridge stripes and on the planes continuous thereto (the exposed face of the p-type wave guide layer).

After the first protective film provided over the p-type contact layer is thus removed, a p-electrode composed of Ni/Au (100 Å/1500 Å) is formed on the surface of the p-type contact layer thus exposed. The p-electrode is formed over the protective film at a stripe width of 100 μm.

Either before or after the formation of this p-electrode, a striped n-electrode composed of Ti/Al (100 Å/5000 Å) is formed on the surface of the n-type contact layer already exposed, parallel to the previous stripe.

Next, a protective film composed of $SiO_2$ is provided, using the desired region as a mask, to provide a take-off electrode for the p-electrode and n-electrode. Here, a protective film composed of $SiO_2$ is also provided to the paired cavity facet on the reflecting face side and cavity facet on the light emission face side.

After this, a pad electrode is provided on the p-electrode composed of RhO—Pt—Au (3000 Å-1500 Å-6000 Å). A pad electrode is provided on the n-electrode composed of Ni—Ti—Au (1000 Å-1000 Å-8000 Å).

After the n-electrode and p-electrode had thus been formed, the sapphire substrate of the wafer is polished down to 200 μm. Then, this obtained wafer is cut into bar by scribing and braking along the above mentioned cavity facets (the light emission face sides), that is, in a direction perpendicular to the striped p- and n-electrodes.

Finally, the wafer is cut into chips in a direction parallel to the p-electrode to obtain laser elements (cavity length of 300 μm).

Figure 3A:
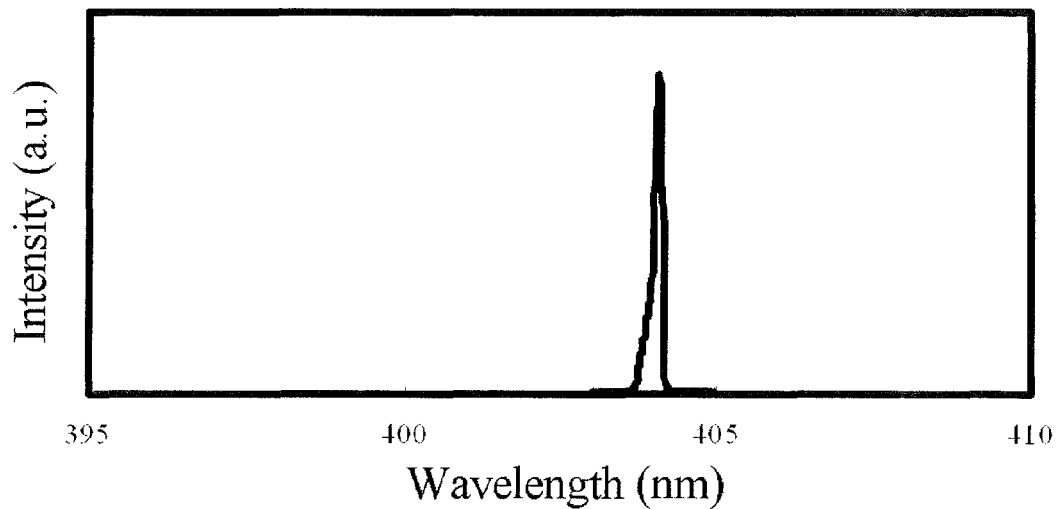
FIG. 3a is a graph of the spectrum of the laser element of the present invention.
Figure 3B:
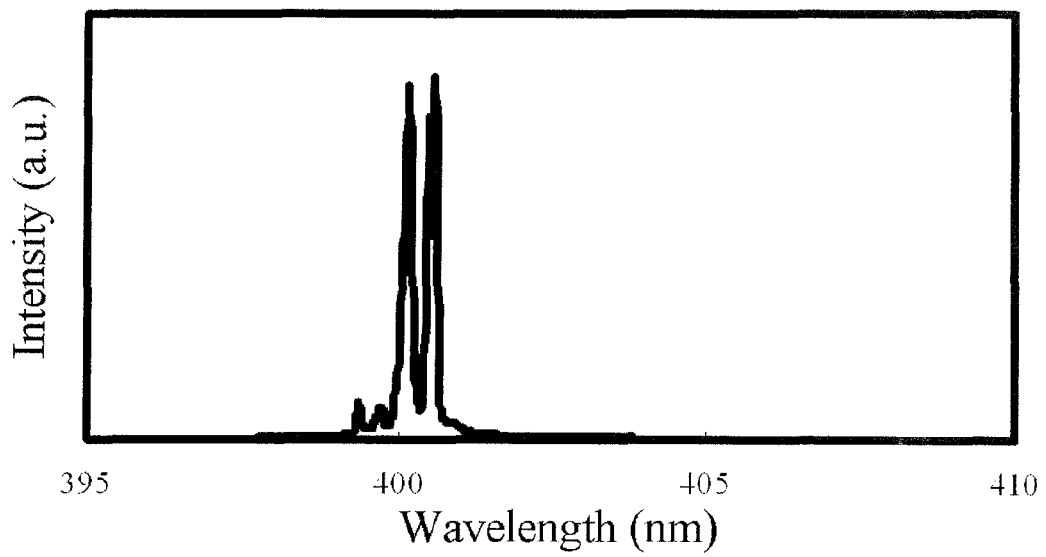
FIG. 3b is a graph of the spectrum of the conventional laser diode.

With this laser element, because a region with a high aluminum ratio is formed on the raised portion top faces of the diffraction grating, a refractive index differential can be ensured, and when this laser element is actually oscillated, as shown in FIG. 3a, a single longitudinal mode spectrum peak is obtained at 30 mW. Another laser element is produced as a reference example in the same manner except that no diffraction grating is formed, and when it is oscillated, as shown in FIG. 3b, it can be seen that a single longitudinal mode spectrum peak is not obtained at 10 mW, while a multi longitudinal mode spectrum peak is obtained.

Example 2

Figure 4:
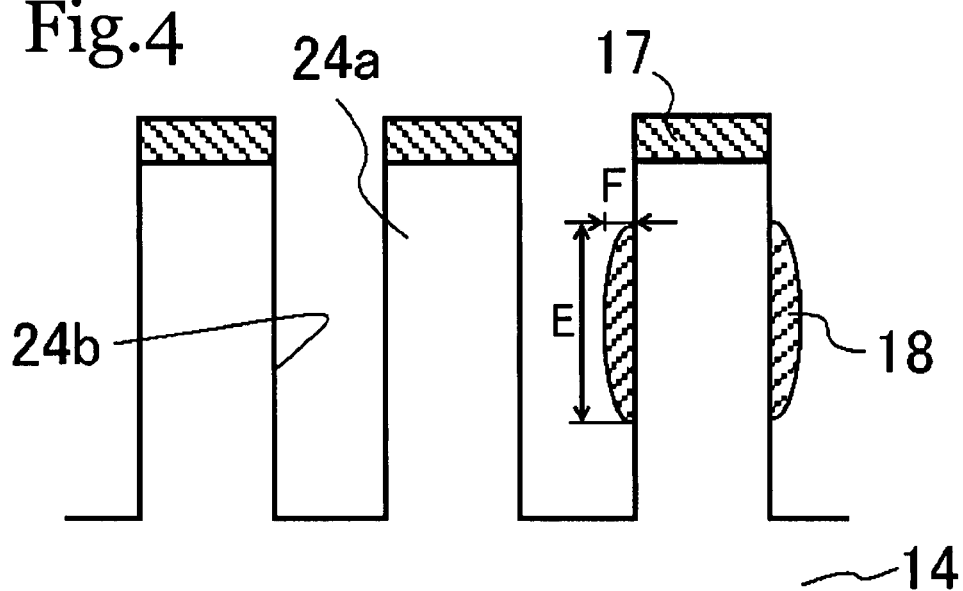
FIG. 4 is a simplified cross section illustrating diffraction grating in another aspect of the laser element of the present invention.

As shown in FIG. 4, the laser element in this Example is constituted the same as the laser element in Example 1, except that a region 18 with a high aluminum mixed crystal ratio, a thickness F of 5 nm, and a length E of 50 nm is formed on the side faces of the raised portions 24a of the diffraction grating 24 formed on a wave guide layer within a second semiconductor layer 14. The region 18 composed of AlGaN with a high aluminum mixed crystal ratio has the same aluminum content as the region 17 with a high aluminum mixed crystal ratio of the raised portions 24a, and the ratio thereof is 0.15.

This laser element is manufactured as follows.

After forming p-type wave guide layer, an $SiO_2$ film (200 nm thick) is formed on this layer, and on this is formed a resist layer (200 nm thick). Using electron beam lithography, a pattern corresponding to diffraction grating is formed in the resist layer. This resist pattern is used as a mask to transfer the pattern to the $SiO_2$ film, and then the $SiO_2$ film and resist layer thus patterned are used as a mask to dig down 135 nm into the p-type wave guide layer and the layer with a high aluminum mixed crystal ratio by RIE, with the pressure suitably adjusted to a range of 0.05 to 10 Pa, for example. The result of this is that the diffraction grating of this Example is formed.

After the mask pattern had been removed, an A layer composed of undoped $Al_{0.13}Ga_{0.87}N$ is grown to a thickness of 25 Å at 1000° C. and at a V/III ratio (the flux of raw material gas containing nitrogen atoms to the flux of raw material gas containing Group III element atoms) of approximately 2000 or higher. A pause of at least 5 seconds is provided, after which a B layer composed of magnesium-doped GaN is grown to a thickness of 25 Å using $Cp_2Mg$. The process of alternately laminating the A layer and B layer is repeated 94 times to grow a p-type clad layer composed of a superlattice layer with a total thickness of 0.47 μm.

This allows a region with a high aluminum content to be disposed on the raised portions and the side faces of the raised portions that make up the diffraction grating, and allows a p-type clad layer to be grown flat over the diffraction grating With this laser element, because a mixed crystal region with a high aluminum ratio is formed on the raised portion top faces of the diffraction grating, a refractive index differential can be ensured, and when this laser element is actually oscillated, as shown in FIG. 3a, a single longitudinal mode spectrum peak is obtained at 30 mW.

Example 3

As shown in FIG. 6, the laser element in this Example is constituted the same as the laser element in Example 1, except that the side faces of the recessed portions 24b the diffraction grating 24 formed on the wave guide layer in the second semiconductor layer 14 has a shape that is sloped at a slope angle γ of 60° or less and at a length G of 30 nm from the bottom face. Although not shown in FIG. 6, the region 17 with a high aluminum ratio is formed in a thickness of 35 nm on the top faces of the raised portions 24a in the shape shown in FIG. 8a.

This recessed and raised portions are manufactured as follows.

On the p-type wave guide layer, an $SiO_2$ film (200 nm thick) is formed on this layer, and on this is formed a resist layer (200 nm thick). Using electron beam lithography, a pattern corresponding to diffraction grating is formed in the resist layer. This resist pattern is used as a mask to transfer the pattern to the $SiO_2$ film, and then the $SiO_2$ film and resist layer thus patterned are used as a mask to form the diffraction grating by RIE. At this etching process, the etching pressure is set at 8 Pa initially and thereafter is changed to 4 Pa, for example, to form a bottom and a inclined faces corresponding to a inclined portion ("G" region in FIG. 6), and then the pressure is suitably adjusted to a range of 0.05 to 10 Pa to dig down 135 nm into the p-type wave guide layer and form a side face thereof.

After the mask pattern is removed, an A layer composed of undoped $Al_{0.13}Ga_{0.87}N$ is formed in a thickness of 25 Å at 1000° C. with the raw material gas flux, pressure, and other conditions adjusted. A B layer composed of magnesium-doped GaN is grown to a thickness of 25 Å using $Cp_2Mg$. The process of alternately laminating the A layer and B layer is repeated 94 times to grow a p-type clad layer composed of a superlattice layer with a total thickness of 0.47 μm.

This allows a region with a high aluminum content to be disposed over the raised portions and the side faces of the raised portions that make up the diffraction grating, and allows a p-type clad layer to be grown flat over the diffraction grating.

With this laser element, because a mixed crystal region with a high aluminum ratio is formed on the raised portion top faces of the diffraction grating, a refractive index differential can be ensured, and when this laser element is actually oscillated, as shown in FIG. 3a, a single longitudinal mode spectrum peak is obtained at 30 mW.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention is provided for illustration only, and not for the purpose of limiting the invention as defined by the appended claims and their equivalents.

The invention claimed is:

1. A nitride semiconductor laser element comprising:
a substrate; and
a nitride semiconductor layer in which a first semiconductor layer, an active layer, and a second semiconductor layer are laminated in this order on the substrate,
wherein at least one of the first semiconductor layer and the second semiconductor layer includes a first section forming recessed and raised portions and a second section embedding the recessed and raised portions of the first section,
a region with a higher aluminum mixed crystal ratio than the second section that embeds the recessed and raised portions is disposed on top faces of the raised portions of the first section, and
the nitride semiconductor layer defines resonant planes, and the recessed and raised portions are formed in a shape of stripes that extend substantially parallel to the resonant planes.

2. The nitride semiconductor laser element according to claim 1, wherein the aluminum mixed crystal ratio of the top faces of the raised portions is higher than that inside the recessed portions.

3. A nitride semiconductor laser element comprising:
a substrate; and
a nitride semiconductor layer in which a first semiconductor layer, an active layer, and a second semiconductor layer are laminated in this order on the substrate,
wherein at least one of the first semiconductor layer and the second semiconductor layer includes a first section forming recessed and raised portions and a second section embedding the recessed and raised portions of the first section
a region with a higher aluminum mixed crystal ratio than at least one of the first section and the second section is disposed between the raised portions of the first section and the second section,
the nitride semiconductor layer defines resonant planes, and the recessed and raised portions are formed in a shape of stripes that extend substantially parallel to the resonant planes.

4. The nitride semiconductor laser element according to claim 3, wherein the region with a high aluminum mixed crystal ratio is disposed on top faces of the raised portions.

5. The nitride semiconductor laser element according to claim 1, wherein the region with a high aluminum mixed crystal ratio is part of the second section that embeds the recessed and raised portions.

6. The nitride semiconductor laser element according to claim 1, wherein a region with a higher aluminum mixed crystal ratio than the second section that embeds the recessed and raised portions is further disposed on part of side faces of the raised portions.

7. The nitride semiconductor laser element according to claim 1, wherein side faces of the raised portions are sloped at an angle of −30° to 30° with respect to the normal direction of the substrate.

8. The nitride semiconductor laser element according to claim 1, wherein the first section that forms the recessed and raised portions is a layer composed of $Al_cGa_{1-c}N$ ($0 \leq c \leq 0.20$).

9. The nitride semiconductor laser element according to claim 1, wherein the second section that embeds the recessed and raised portions is a layer composed of $Al_aGa_{1-a}N$ ($0 \leq a \leq 0.50$).

10. The nitride semiconductor laser element according to claim 1, wherein the second section that embeds the recessed and raised portions has higher aluminum mixed crystal ratio than the first section that forms the recessed and raised portions.

11. The nitride semiconductor laser element according to claim 1, wherein the second section that embeds the recessed and raised portions includes a superlattice layer made up of a first layer composed of $Al_aGa_{1-a}N$ ($0 \leq a \leq 0.10$) and a second layer composed of $Al_bGa_{1-b}N$ ($0.05 \leq b \leq 0.14$).

12. The nitride semiconductor laser element according to claim 1, wherein the first section that forms the recessed and raised portions has a sloped face that is contiguous from a side face of the raised portion to a bottom face of the recessed portion, and the sloped face is sloped at from ½ to ¹/₁₀ a height of the recessed and raised portions.

13. The nitride semiconductor laser element according to claim 12, wherein the slope angle of the sloped face is from 20 to 70° with respect to the normal direction of the substrate.

14. The nitride semiconductor laser element according to claim 1, wherein a width of the raised portions and a width of the recessed portions are from ¹/₁₅ to 8 times a height of the recessed and raised portions.

15. The nitride semiconductor laser element according to claim 1, wherein a width of the recessed and raised portions has a pitch of from 40 to 400 nm.

16. The nitride semiconductor laser element according to claim 1, wherein the surface of the second section that embeds the recessed and raised portions is formed substantially flat.

17. The nitride semiconductor laser element according to claim 3, wherein the region with a high aluminum mixed crystal ratio is part of the second section that embeds the recessed and raised portions.

18. The nitride semiconductor laser element according to claim 3, wherein a region with a higher aluminum mixed crystal ratio than the second section that embeds the recessed and raised portions is further disposed on part of side faces of the raised portions.

19. The nitride semiconductor laser element according to claim 3, wherein side faces of the raised portions are sloped at an angle of −30° to 30° with respect to the normal direction of the substrate.

20. The nitride semiconductor laser element according to claim 3, wherein the first section that forms the recessed and raised portions is a layer composed of $Al_cGa_{1-c}N$ ($0 \leq c \leq 0.20$).

21. The nitride semiconductor laser element according to claim 3, wherein the second section that embeds the recessed and raised portions is a layer composed of $Al_aGa_{1-a}N$ ($0 \leq a \leq 0.50$).

22. The nitride semiconductor laser element according to claim 3, wherein the second section that embeds the recessed and raised portions has higher aluminum mixed crystal ratio than the first section that forms the recessed and raised portions.

23. The nitride semiconductor laser element according to claim 3, wherein the second section that embeds the recessed and raised portions includes a superlattice layer made up of a first layer composed of $Al_aGa_{1-a}N$ ($0.05 \leq a \leq 0.10$) and a second layer composed of $Al_bGa_{1-b}N$ ($0.05 \leq b \leq 0.14$).

24. The nitride semiconductor laser element according to claim 3, wherein the first section that forms the recessed and raised portions has a sloped face that is contiguous from a side face of the raised portion to a bottom face of the recessed portion, and the sloped face is sloped at from ½ to ¹⁄₁₀ a height of the recessed and raised portions.

25. The nitride semiconductor laser element according to claim 24, wherein the slope angle of the sloped face is from 20 to 70° with respect to the normal direction of the substrate.

26. The nitride semiconductor laser element according to claim 3, wherein a width of the raised portions and a width of the recessed portions are from ¹⁄₁₅ to 8 times a height of the recessed and raised portions.

27. The nitride semiconductor laser element according to claim 3, wherein a width of the recessed and raised portions has a pitch of from 40 to 400 nm.

28. The nitride semiconductor laser element according to claim 3, wherein the surface of the second section that embeds the recessed and raised portions is formed substantially flat.

* * * * *